United States Patent [19]

Kerschner et al.

[11] Patent Number: 5,469,064
[45] Date of Patent: Nov. 21, 1995

[54] ELECTRICAL ASSEMBLY TESTING USING ROBOTIC POSITIONING OF PROBES

[75] Inventors: Ronald K. Kerschner; John M. Heumann; John E. McDermid; Ed. O. Schlotzhauer; David T. Crook, all of Loveland, Colo.

[73] Assignee: Hewlett-Packard Company, Palo Alto, Calif.

[21] Appl. No.: 122,031

[22] Filed: Sep. 15, 1993

Related U.S. Application Data

[63] Continuation-in-part of Ser. No. 820,711, Jan. 14, 1992, Pat. No. 5,274,336.

[51] Int. Cl.[6] .................................................. G01R 31/02
[52] U.S. Cl. ........................... 324/537; 324/758; 324/761
[58] Field of Search ...................................... 324/500, 519,
324/522, 523, 525, 537, 690, 718, 724,
754, 761, 758

[56] References Cited

U.S. PATENT DOCUMENTS

| | | | |
|---|---|---|---|
| 4,544,889 | 10/1985 | Hendriks et al. | 324/758 |
| 4,565,966 | 1/1986 | Burr et al. | 324/519 |
| 5,003,254 | 3/1991 | Hunt et al. | 324/158 F |
| 5,006,808 | 4/1991 | Watts | 324/537 |
| 5,030,907 | 7/1991 | Yih et al. | 324/158 F |
| 5,032,788 | 7/1991 | Ringleb et al. | 324/158 F |
| 5,107,206 | 4/1992 | Yanagi et al. | 324/158 F |
| 5,111,137 | 5/1992 | Heumann et al. | 324/158 R |
| 5,124,660 | 6/1992 | Cilingiroglu | 324/538 |
| 5,150,041 | 9/1992 | Eastin et al. | 324/758 |
| 5,157,325 | 10/1992 | Murphy | 324/761 |
| 5,254,953 | 10/1993 | Crook et al. | 324/538 |
| 5,268,645 | 12/1993 | Prokoff et al. | 324/537 |
| 5,321,351 | 6/1994 | Swart et al. | 324/758 |

FOREIGN PATENT DOCUMENTS

| | | |
|---|---|---|
| 2136138 | 9/1984 | United Kingdom . |
| 2267972 | 12/1993 | United Kingdom . |
| 2268277 | 1/1994 | United Kingdom . |

*Primary Examiner*—Kenneth A. Wieder
*Assistant Examiner*—Glenn W. Brown
*Attorney, Agent, or Firm*—Cynthia S. Baan

[57] ABSTRACT

The present invention is an improved printed circuit board test system in which test probes are positioned to electronically engage a selected device or printed circuit board section on a printed circuit board for testing the printed circuit board for manufacturing defects. The printed circuit board test system uses a bed-of-nails test fixture to ground and excite predetermined sites on a first side of the printed circuit board and a robot to mechanically position test probe(s) at selected test sites on a second side of the printed circuit board. A controller is used to control the movement of the robotic tester and the selection of spring probes in the bed-of-nails fixture to be exited, grounded or measured.

21 Claims, 10 Drawing Sheets

ELECTRICAL ASSEMBLY TESTING USING ROBOTIC POSITIONING OF PROBES

CROSS-REFERENCE TO RELATED APPLICATIONS

This application is a continuation-in-part of U.S. patent application Ser. No. 07/820,711, filed on Jan. 14, 1992 by Crook et al., now U.S. Pat. No. 5,274,336 which is commonly owned by the same assignee as the present application and is incorporated by reference for all that it contains.

FIELD OF THE INVENTION

This invention relates generally to testing of electronic assemblies such as printed circuit boards and multi-chip modules and more specifically to the use of robotics to position stimulus devices and test probes.

BACKGROUND OF THE INVENTION

Manufacturing of electronic assemblies such as printed circuit boards requires testing after the components have been placed on the printed circuit board in order to determine the proper continuity of interconnections, placement and connection of components, and board function. Several different approaches have been developed for testing the components and printed circuit (P.C.) boards, including functional testing, in-circuit testing, and continuity testing.

Functional testing uses a procedure of applying predetermined input signals to a printed circuit board and monitoring the output of a printed circuit board via an edge connector to determine if all of the components are present and operating properly on the board. While functional testing provides a way of determining whether a printed circuit board is functioning properly, it provides little or no information regarding the functioning of individual components on the board. Complex programming techniques have been used to provide limited information as to the location of non-functioning components on the board by carefully selecting input data and analyzing the output results. Such systems are complex, often costly to implement, and normally provide only vague information as to the location of malfunctioning components. Therefore, if an edge-connector test indicates a faulty printed circuit board, it is frequently desirable to "backtrace" through the circuit from the failing output to find the source of the problem. Backtracing is frequently performed manually, which requires an operator to hold a probe in physical contact with a pad or other test point on the board. Today's fine pitch geometries make this extremely impractical.

Due to the limitations of functional testing, in-circuit testing techniques have been used to individually test each of the components on a printed circuit board to determine if these components are working properly. This testing method uses a "bed-of-nails" fixture employing fixed position spring-loaded probes which establish an ohmic contact by pressing against various test points on a printed circuit board or against the leads of each component in order to access and test each individual component. In this manner, non-functioning components can be readily identified and replaced, thus preventing the entire circuit board from being scrapped. This process works well for simple components where the circuit inside the component is known and can be easily tested. Also, because the devices are independently tested, tests for many common digital integrated circuits can be programmed once, in advance, stored in a library and then called upon when needed. This greatly simplifies test generation, since this preprogrammed test can be used over and over again. However, if the component being tested is very complex, or if the circuit inside the component is unknown, in-circuit testing may not achieve satisfactory results.

Also, integrated circuit packages have evolved from packages with 16–20 leads spaced 0.1" (2.5 mm) apart to packages which have hundreds of leads with spacing of 0.025" (0.6 mm). These state-of-the-art technologies have increased packaging densities at the cost of test accessibility. As the number of leads on integrated circuit packages continues to increase and the spacing between leads (pitch) continues to decrease, the design and manufacture of test probes and fixtures becomes more and more difficult. This is exasperated by the fact that manufacturing variances can be as much as or even exceed current lead pitches, making it difficult for a bed-of-nails test fixture to accurately access the leads and components of every printed circuit board. This is complicated further by assemblies which have components placed on both sides so that double-sided "clam-shell" fixtures are required, which still may not be able to access all of the components that are required to be tested. Accordingly, there is a need for a different approach to testing fine-pitch components. In particular, instead of probes with fixed positions, probes need to be moveable to accommodate various manufacturing tolerances in assemblies and fixtures. Alternatively, some assembly designs need a hybrid approach using a combination of fixed and moveable probes.

Another disadvantage of bed-of-nails test fixtures is that designing one (or two in the case of double sided P.C. boards) bed-of-nails test fixtures for each printed circuit board can be extremely expensive. As the test fixtures grow in complexity, it becomes more and more difficult to determine if the test fixtures were properly built or if there are any incorrectly wired test probes. This is not just a problem of testing for initial fixture manufacturing defects, but there is an on going need for diagnosis of faults in fixtures which may appear later. Accordingly, there is a need for flexible, programmable testing of test fixtures.

One recent solution to the complexity and expense of dedicated bed-of-nails testers is a robotic tester. For example, in U.S. Pat. No. 5,107,206, by Yanagi et al., four spring probes are mechanically positioned over a printed circuit board so that components can be tested. Prior art FIGS. 1 and 2 illustrate the manner in which test probes 11–15 electrically contact leads 16–20 of integrated circuit 21 and solder joints 22–25, which connect the integrated circuit 21 to printed circuit board 26.

The disadvantages of this approach are two fold. First of all, the test is much slower than the standard bed-of-nails tester, due to the added time for positioning the probes and the fact that for most individual tests all of the probes must be used—one for excitation, one for measuring, and one or more for grounding upstream elements that could be electrically damaged by the test. A second disadvantage is that the robot is programmed to bring the test probes down at predefined test points. These predefined test points may actually be slightly different from the intended test points due to manufacturing variances, causing the robot to miss its intended test point. When the robot "misses" it can cause damage to the printed circuit board, the wiring traces, the component leads, and the components themselves. Because the spring probes must come into intimate electrical contact with the elements on the printed circuit board, damage can occur even with proper alignment of the board under test. As can be appreciated from viewing FIGS. 1 and 2, there is very little room for manufacturing variances with the test system of Yanagi et al. Accordingly, there is a need for a test system that can perform tests without the expense of elaborate, individually dedicated bed-of-nails fixtures and without damaging the printed circuit board or the components thereon.

Another very important potential problem that must be tested for on every printed circuit board is whether all the pins of every component are in fact soldered to the circuit board. Functional testing may miss a particular pin, if the functions performed by that particular pin are not thoroughly tested in the functional test. Testing for this type of fault is particularly difficult when the circuit inside the component is unknown, such as the case with application specific integrated circuits (ASICs). Because of the large number of ASICs and the complexity of these devices, it is often not feasible to design a functional test to isolate each component or lead. And, in-circuit testing may give false responses during this type of test, because the spring probes can push the leads of the components down onto the printed circuit board, creating a temporary electrical connection with the wire trace on the printed circuit board, thus falsely indicating a good solder joint.

One recent approach to continuity testing is to stimulate the circuit and then use a non-contact test probe elsewhere in the circuit to determine continuity, or vice versa. Some of these methods include measuring of electromagnetic energy, inductance, capacitance, and thermal energy. For example, in U.S. Pat. No. 5,111,137, electromagnetic radiation is used to induce changes in the current or voltage of a device under test. In U.S. Pat. No. 5,124,660, a capacitive probe is used to induce changes in the current or voltage of a device under test. These probes are especially useful for testing the continuity of individual connections such as wire bonds or soldered connections. These probes may be built into a bed-of-nails test fixture with a single probe for each individual connection to be tested. This approach overcomes the damage that spring probes used in bed-of-nails fixtures and robots can cause to the components and printed circuit boards, but dedicated fixtures utilizing non-contact test probes are just as complex and expensive as ohmic bed-of-nails fixtures. Accordingly, for fine pitch components, an alternative, less expensive approach to the non-contact test probe fixture is needed in which the secondary stimulus and associated test probes are moved precisely to the connection to be tested.

Finally, sometimes a manufacturer or a value added supplier may wish to perform one or more of the post-assembly tests discussed above. This can be very expensive as most of these tests are performed by different machines and many of these tests require individually dedicated test fixtures, libraries, and programs. Accordingly, there is a need for a test system that can perform multiple post-assembly tests with the least amount of dedicated or redundant equipment, libraries and programs as possible.

SUMMARY OF THE INVENTION

The present invention is a test system and method of testing electronic assemblies having fine pitch parts, double sided electronic assemblies and test fixtures.

It is an aspect of the present invention to provide a test system that provides moveable test probes under robotic control in conjunction with stationary spring probes in a bed-of-nails fixture.

It is a further aspect of the present invention to provide such a test system wherein one or more moveable test probes under robotic control are capable of testing the bed-of-nails fixture for faults.

It is another aspect of the present invention to provide a test system that provides a double sided tester with moveable test probes under robotic control on both sides of a printed circuit board.

It is a further aspect of the present invention to provide a test system with moveable test probes under robotic control, wherein the test probes are non-contact test probes and thus do not give false electrical connections and do not damage the component leads or the wire traces. This also allows reliable probing of dirty, conformal coated, and solder masked printed circuit boards. In fact, even traces present only on inner layers of a multi-layer printed circuit board may be capacitively probed from the surface of the board provided that there are no intervening conductive planes or traces.

It is a further aspect of the present invention to provide a test system with moveable test probes under robotic control, wherein the robotic control means uses electronic vision in order to compensate for manufacturing variances in the position of components on the printed circuit boards and the position of the printed circuit board on the bed-of-nails test fixture.

It is yet a further aspect of the present invention to provide a test system that allows multiple tests to be conducted with the same test fixture equipment.

It is still a further aspect of the present invention to provide a test system with moveable test probes under robotic control, wherein the robotic control means is capable of selecting a different type of test probe depending on the test to be run.

The foregoing and other aspects of the present invention will be understood from the following description of preferred embodiments of the present invention, which are shown in the accompanying drawings.

BRIEF DESCRIPTION OF THE DRAWINGS

The above and other objects, features, and advantages of the present invention will be better understood by reading the following more particular description of the invention, presented in conjunction with the following drawings, wherein.

DETAILED DESCRIPTION OF THE PRESENT INVENTION

The invention is an apparatus and method for non-contact probing of electrical signals by using a miniature capacitively coupled probe. While directed to the unique problems of digital test signal acquisition, the invention has equal utility for acquisition of analog signals. The term "non-contact" refers to coupling in the absence of ohmic contact.

A "probe" is a device which contains the electrical signal sensing element for another piece of electronic equipment. A "connector" and an "edge connector" are used interchangeably to mean any electrical connection on an electrical assembly or printed circuit board that provides electrical access to the electrical assembly or printed circuit board.

The apparatus of the invention has utility for sensing electrical signals from printed circuit board traces, vias, pads, I/O pins, and other electronic conductors. The signals may be acquired through intervening solder mask, conformal coating, integrated circuit package, or one or more dielectric layers of a multi-layer printed circuit board, hybrid, or multi-chip module. For ease of reference, the term "trace" shall be used herein to refer to any electrical signal carrying conductor from which signal acquisition is desired. The invention is now described with reference to the figures where like reference numbers are used to indicate like elements.

Figure 1:
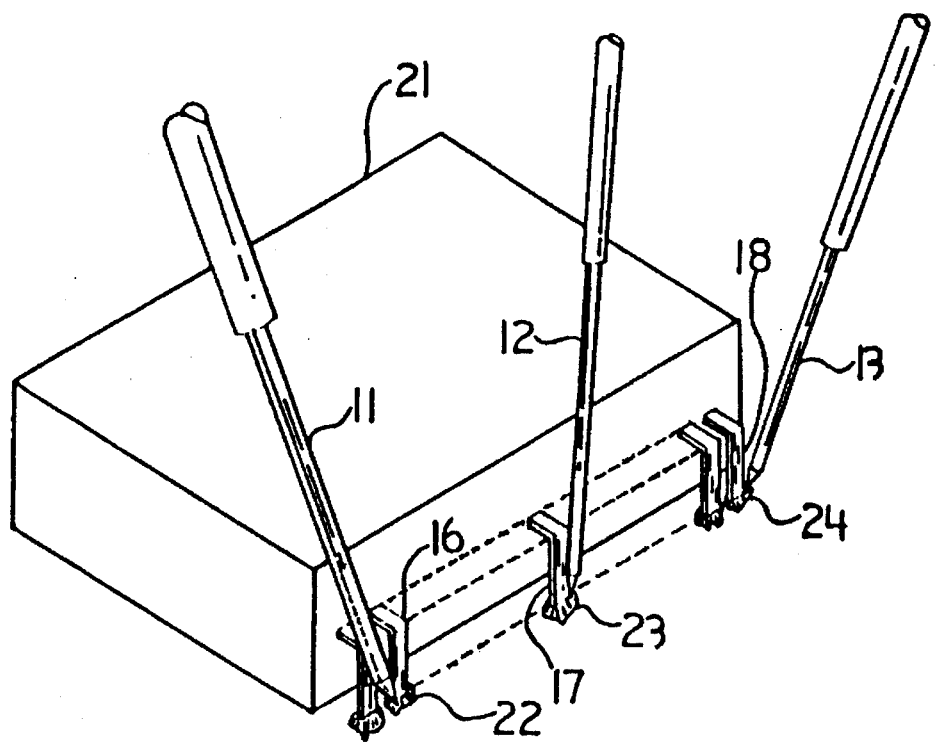
FIG. 1 shows a perspective view of an integrated circuit under test using conventional testing techniques.
Figure 2:
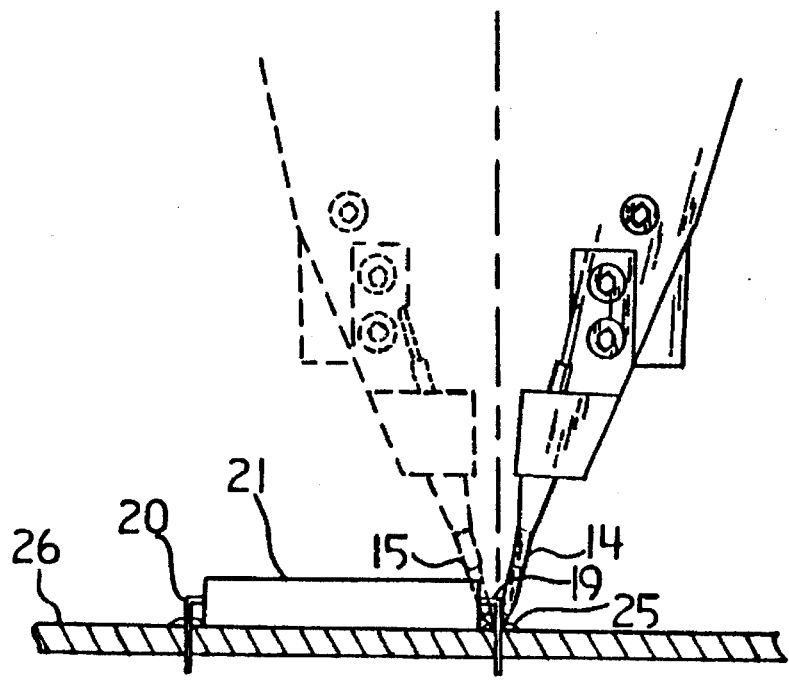
FIG. 2 shows a side view of an integrated circuit under test using conventional testing techniques.
Figure 3:
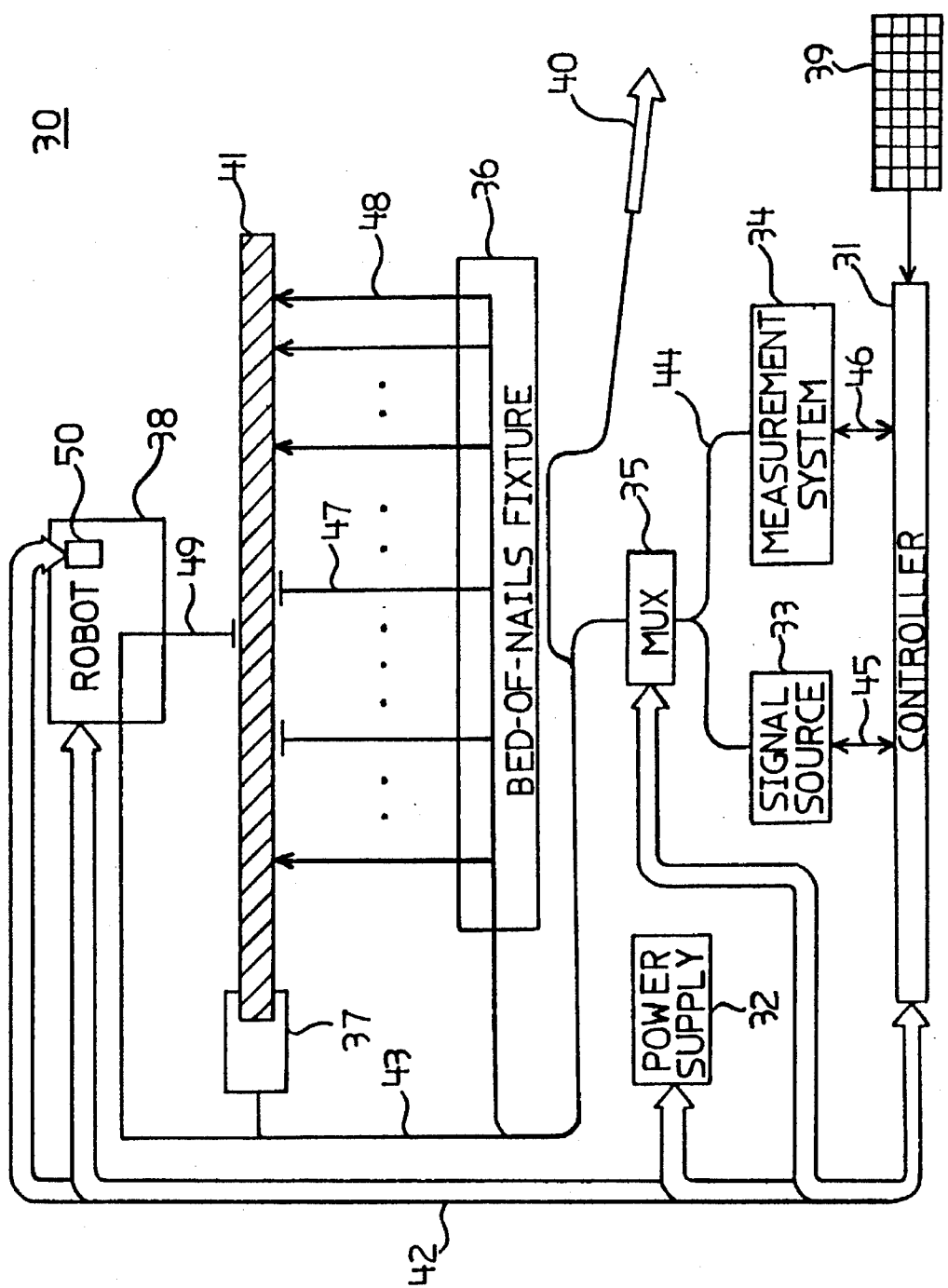
FIG. 3 shows a block diagram of an electronic printed circuit board test system according to a first embodiment of the present invention.

FIG. 3 shows a block diagram of a printed circuit board test system according to a first embodiment of the present invention. Referring now to FIG. 3, test system 30 contains a controller 31, a power supply 32, a signal source 33, a measurement system 34, a mulitplexor (MUX) 35, a bed-of-nails fixture 36, an edge connector 37, a robotic probe positioner 38, an optional test and data input device, such as key board 39, and an optional hand-held probe 40. A printed circuit board or assembly under test (BUT) 41 is interfaced with system 30 over a signal bus 43 via edge connector 37 and/or bed-of-nails fixture 36.

Power supply 32 provides power to the BUT 41 over signal bus 43. Signal source 33 includes analog function and frequency generators and digital pattern generators which generate the test signals required for testing the BUT 41. Measurement system 34 includes a plurality of digital receivers, signature analysis circuitry, and a variety of analog and/or digital measurement instrumentation (e.g., oscilloscopes, logic analyzers, distortion meters, etc.).

MUX 35 receives test signals from signal source 33 over bus 44 and supplies these test signals to the appropriate nodes of BUT 41 over signal bus 43. MUX 35 further receives signals from the appropriate nodes of BUT 41 over signal bus 43 and provides these signals to measurement system 34 over bus 44.

Controller 31 controls testing of board 41. Controller 31 communicates with signal source 33 over bus 45 and with measurement system 34 over bus 46. Controller 31 communicates with power supply 32, MUX 35, and robotic positioner 38 over a control bus 42. The user may alternatively enter data, such as a test library, test selection, etc., by any known data entry means, such as key board 39.

Bed-of-nails fixture 36 may include a plurality of capacitive probes 47, conventional ohmic probes 48, or any other type of contact or non-contact test probe now known or later developed. Further, any type of ohmic, inductive, capacitive, electro-optic, electron beam, thermal, or other type of contact or non-contact test probe 49 may be used with robotic probe positioner 38 and with hand-held test probe 40.

Robotic probe positioner 38 may include a miniature camera 50 for more accurate placement of the test probe 49. Camera 50 may communicate with controller 31 via control bus 42.

Figure 4:
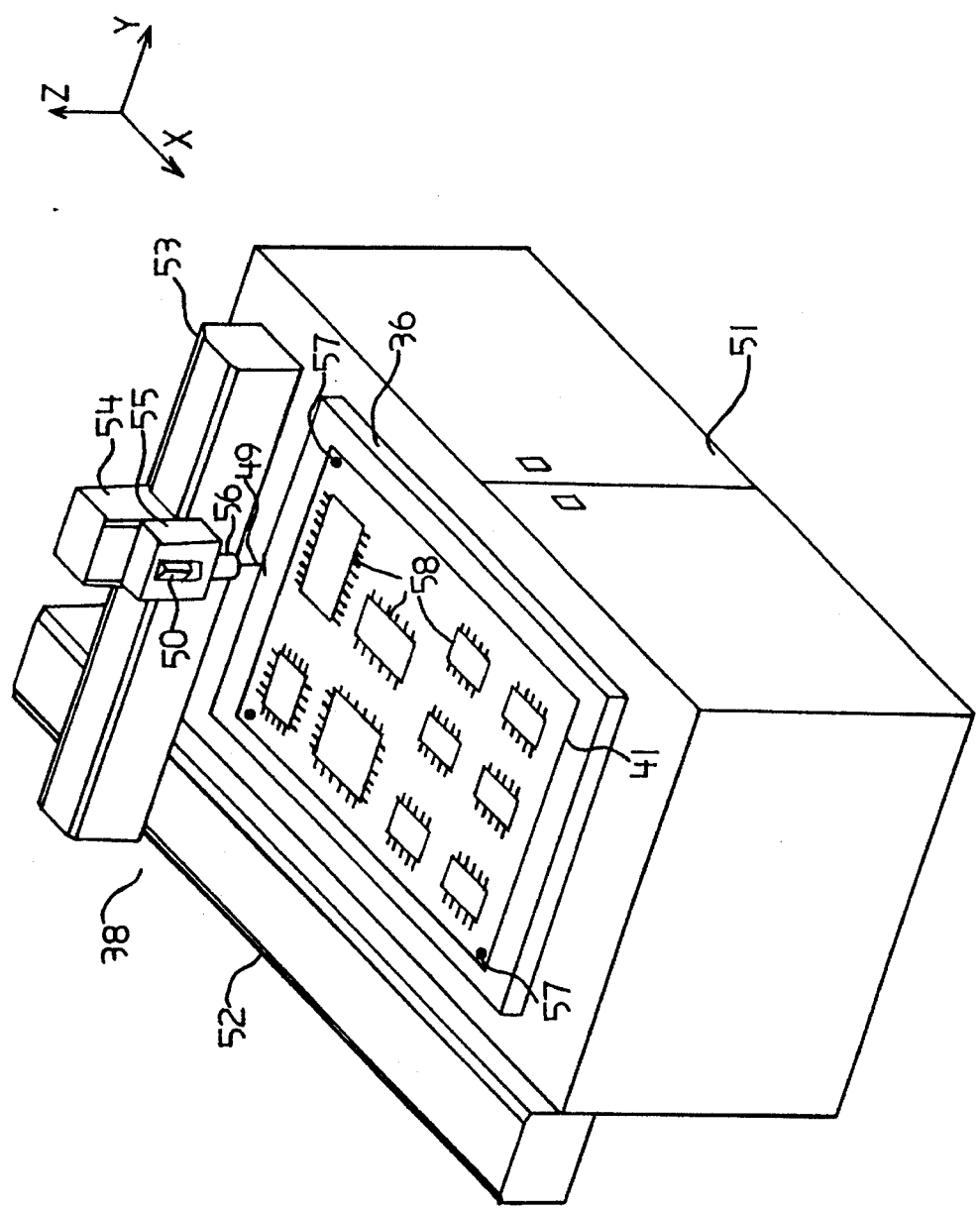
FIG. 4 shows a perspective view of the first embodiment of the present invention.

FIG. 4 shows a perspective view of the first embodiment of the present invention. Referring now to FIG. 4, the proposed physical layout of the present invention can be appreciated. By way of example only, Robot 38 may be a Sony SRX-450, having an X direction positioning arm 52, an Y direction positioning arm 53, an Z direction positioning arm 54, a probe head 55, and a probe holder 56. Camera 50, attached to robot 38 may be any miniature, high quality camera. Robot 38 is coupled to a test head 51, such as Hewlett-Packard's HP 3070, which also houses a dedicated bed-of-nails fixture 36.

In order to test printed circuit board 41, first necessary data about the printed circuit board 41 (e.g., coordinates of elements, circuit features, what type of tests will be run etc.) is entered into the controller of test system 30 by any known means. Next, the board 41 is fixedly mounted to the test head 51 or the bed-of-nails fixture 36. The printed circuit board 41 may also be connected to an edge connector 37, shown in FIG. 3. Before the test begins, the robot 38 will move the camera 50 over the printed circuit board 41, locating the fiducials 57. Once the fiducials 57 have been located, the coordinates of the fiducials will be sent back to the controller, which will use the data to make minor corrections to the coordinates of the elements 58 or to re-zero the axis of robot 38.

Next, the controller 31 will begin the first test. The edge connector 37 may be used to perform a functional test, the bed-of-nails fixture 36 may be used to perform an in-circuit test, or the robot 38 may be used in conjunction with the bed-of-nails fixture 36 to determine whether all of the elements 58 are properly soldered to the circuit board 41. Other tests are also possible, utilizing other combinations of the edge-connector 37, the bed-of-nails fixture 36 and the robot 38.

When the robot 38 is used during the testing of the printed circuit board 41, the controller 31 sends the coordinates of the element to be tested to the robot 38, which moves the probe head 55 to the appropriate position. The robot 38 may contain a precision positioning circuit whereby the camera 50 sends an error signal to the controller 31, which corrects the position of the robot's axis and thus adjusts the position of the test probe 49. Such a precision positioner circuit would compensate for minor manufacturing variances in the placement of elements 58. Once the test probe 49 is positioned, the controller begins the selected test. If a predetermined result is not measured, the controller 31 may use the robot 38 to perform back tracing or the hand-held probe 40 may be used to perform back tracing manually.

As noted previously, bed-of-nails test fixtures are becoming more and more complex, which makes it very difficult to detect manufacturing errors in the test fixtures themselves. The present invention solves this problem as robot 38 can be used to verify that all test probes 47 and 48 in the bed-of-nails test fixture 36 are properly wired and positioned. This verification test would be run before the printed circuit board testing began.

Since it is not the purpose of this application to describe in detail all of the possible tests that can be conducted with the test system of the present invention, the description of the various tests (e.g., functional tests, in-circuit tests, etc.) will not be described, especially since the design of such tests are well known in the art, and it would be readily apparent to a test designer, how to implement such tests into the test system of the present invention. However, by way of example only, a test for determining the integrity of circuit board wiring and solder joint connections between the circuit board wiring and the leads of individual components will be described with reference to FIGS. 5–7.

Figure 5:
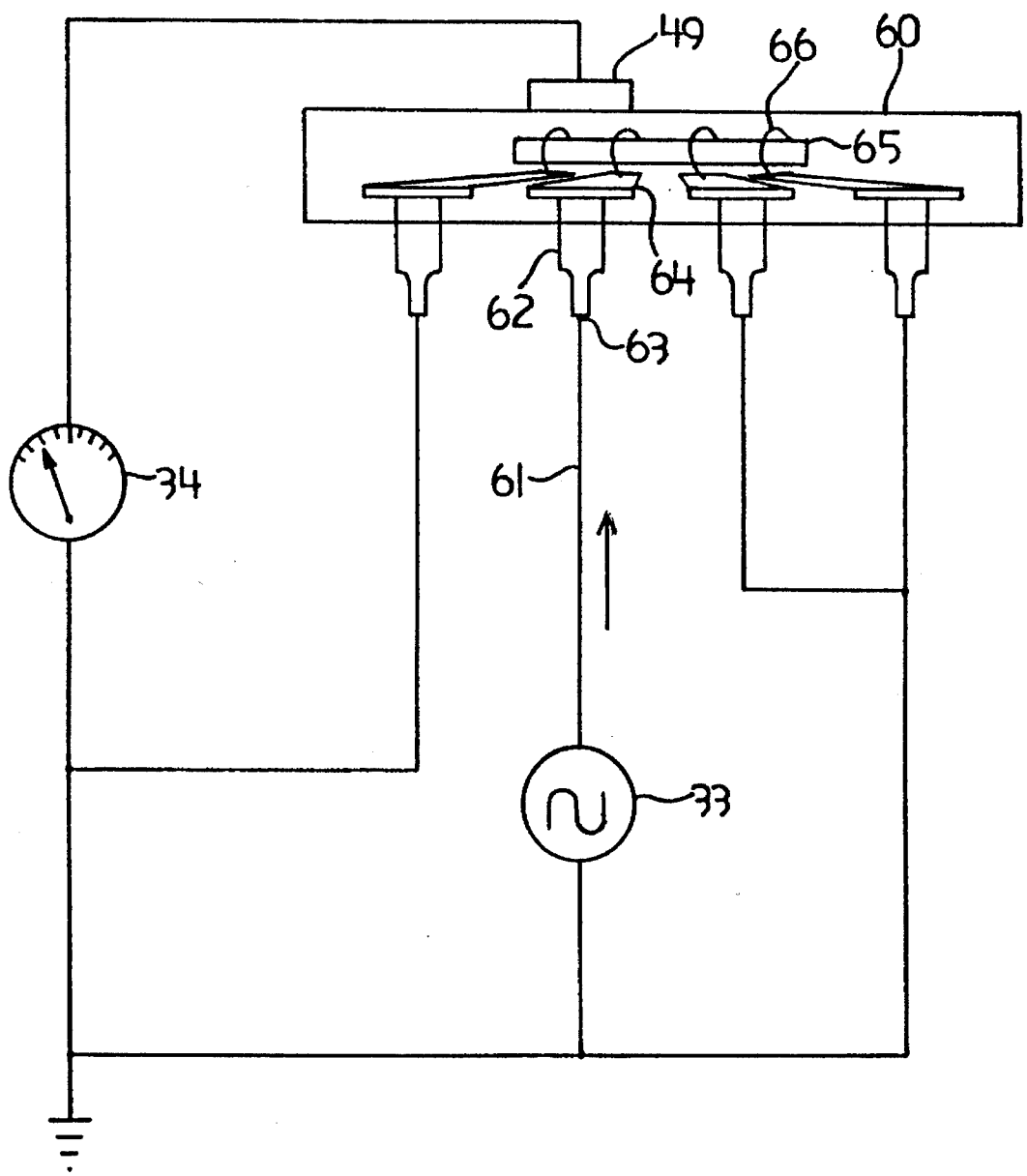
FIG. 5 shows a schematic diagram of an integrated circuit under test according to the first embodiment of the present invention.

FIG. 5 shows a schematic diagram of an integrated circuit 60 being tested with a capacitive test probe 49 to determine open solder joints. The system uses signal source 33, which supplies a signal, typically eight kilohertz (8 KHz) at two hundred millivolts (200 mV). The output of signal source 33 is connected to a printed circuit board trace 61 via a bed-of-nails contact under the printed circuit board 41, as shown in FIG. 3. Wire trace 61 is connected to the integrated circuit lead being tested 62 at position 63. Other component leads may be grounded to prevent damage to up-circuit elements or to prevent capacitive cross-talk between leads, leading to false test results.

A capacitive test probe 49 is positioned over lead connector 64 of the integrated circuit package 60 by robot 38. The capacitive test probe 49 is connected to measuring system 34, such as an ammeter, a voltmeter or computing means to compute the effective capacitance. When the measurement falls outside predetermined limits, a determination is made that the lead being tested is open (i.e., the lead is not soldered or otherwise connected to wire trace 61).

When the test is performed, the signal source 33 supplies a signal to wire trace 61 which should be connected to the lead being tested 62 at location 63. The signal should then pass from the lead 62 to the lead connector 64 of component 60. If there are no opens in wire trace 61 or the connection between wire trace 61 and lead 62, then through capacitive coupling, the signal will be conveyed to capacitive test probe 49 and on to the measuring system 34. If the measured parameter falls within predetermined limits, then lead 62 is connected to wire trace 61. If the lead 62 is not connected to wire trace 61, then a much smaller signal will be received by capacitive test probe 49 and the threshold level of the signal will not be measured by measuring system 34, thus indicating an open fault.

Figure 6:
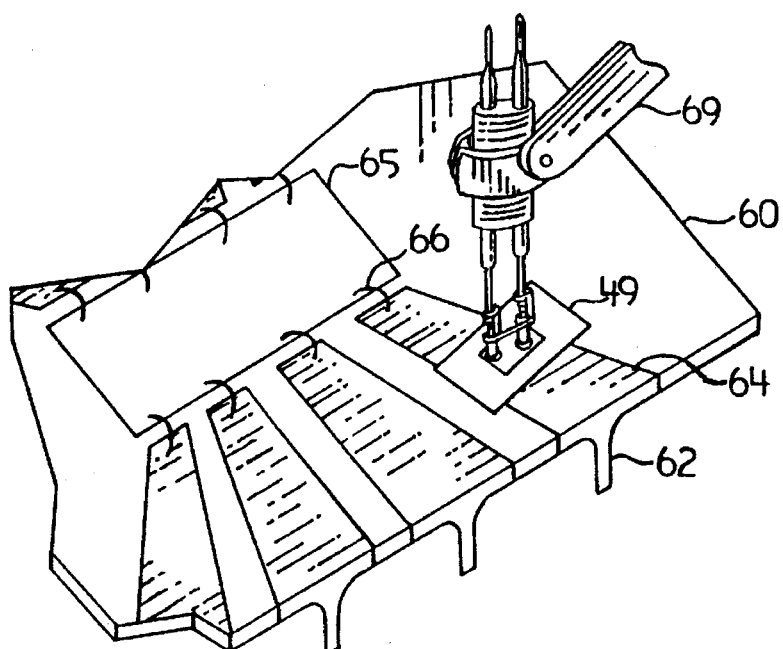
FIG. 6 shows a perspective view of the first embodiment of the present invention, wherein an extremely small capacitive test probe is being used in conjunction with the test robot of the present invention to test each lead of an integrated circuit.

FIG. 6 shows a top cut-away perspective view of capacitive test probe 49 being used in conjunction with the robot to test the integrity of each lead 62 of integrated circuit 60. FIG. 6 also shows die 65 and wires 66, which connect the circuit of die 65 to lead connectors 64, which connect to leads 62 of device 60. It should be appreciated that this test can be run in reverse or used to test the integrity of the connection between die 65 and lead connector 64 by wire 66. For example, a signal or signals can be supplied to predetermined leads or traces of component 60, such that the signal will propagate through the circuit on die 65 and then be detected on lead connector 64. In this manner, the integrity of the connection between die 65 and lead connector 64 (e.g., connective wire 66) can be determined.

This set up can also be mused to perform a type of in-circuit test using a learned value measurement. With the learned value technique, a known good die is measured with the measuring system while running and the capacitive value for each lead connector is stored. Then, the capacitive value for each lead connector of an unknown circuit 60 is measured and compared to the learned capacitance of the good die. If the difference for any lead connector 64 is more than a predetermined value, then the unknown die 65 is either bad or the connective wire 66 is not properly connected between the die 65 and the lead connector 64.

Figure 7:
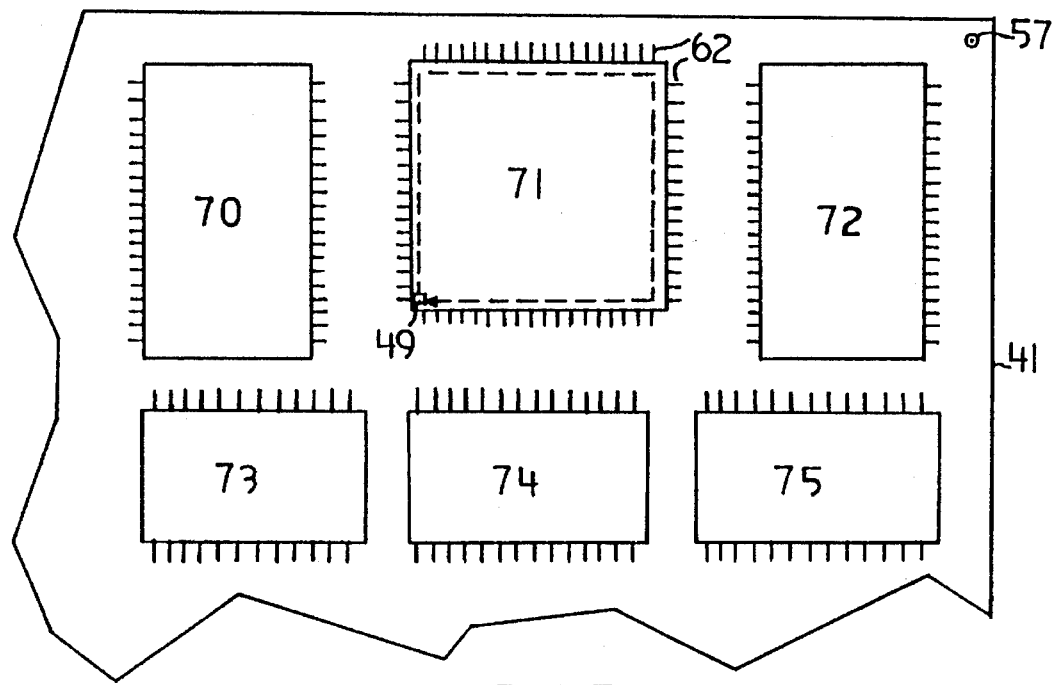
FIG. 7 shows a top partial view of a printed circuit board, indicating a possible path of a capacitive test probe about an integrated circuit under test according to the first embodiment of the present invention.

FIG. 7 shows a top partial view of a printed circuit board 41 with integrated circuit components 70–75. FIG. 7 is provided to illustrate an example path of capacitive test probe 49 about an integrated circuit 71 for performing either a wire trace 61 to lead 62 connection integrity test, a die 65 to lead connector 64 connection integrity test, a digital in-circuit test, or an analog in-circuit test with a non-contact test probe 49.

When a particular test fails and the individual components on a printed circuit board 41 are known, simple robot controlled back tracing may be programmed into the test system 30 of the present invention for many of the above described tests and most other known tests. Alternatively, back tracing may be performed with a hand-held test probe 40.

Since a manufacturer, value added supplier or final customer may want to perform some tests on a printed circuit board that can not be conducted with a capacitive test probe, it may be desirable to change the test probe on the robot. However, to stop testing and change the test probe requires time and manual support—both of which are expensive. Accordingly, FIGS. 8–11 illustrate two alternative embodiments to the present invention that allow the robot to change test probes without substantial lose of time or increased expense.

Figure 8:
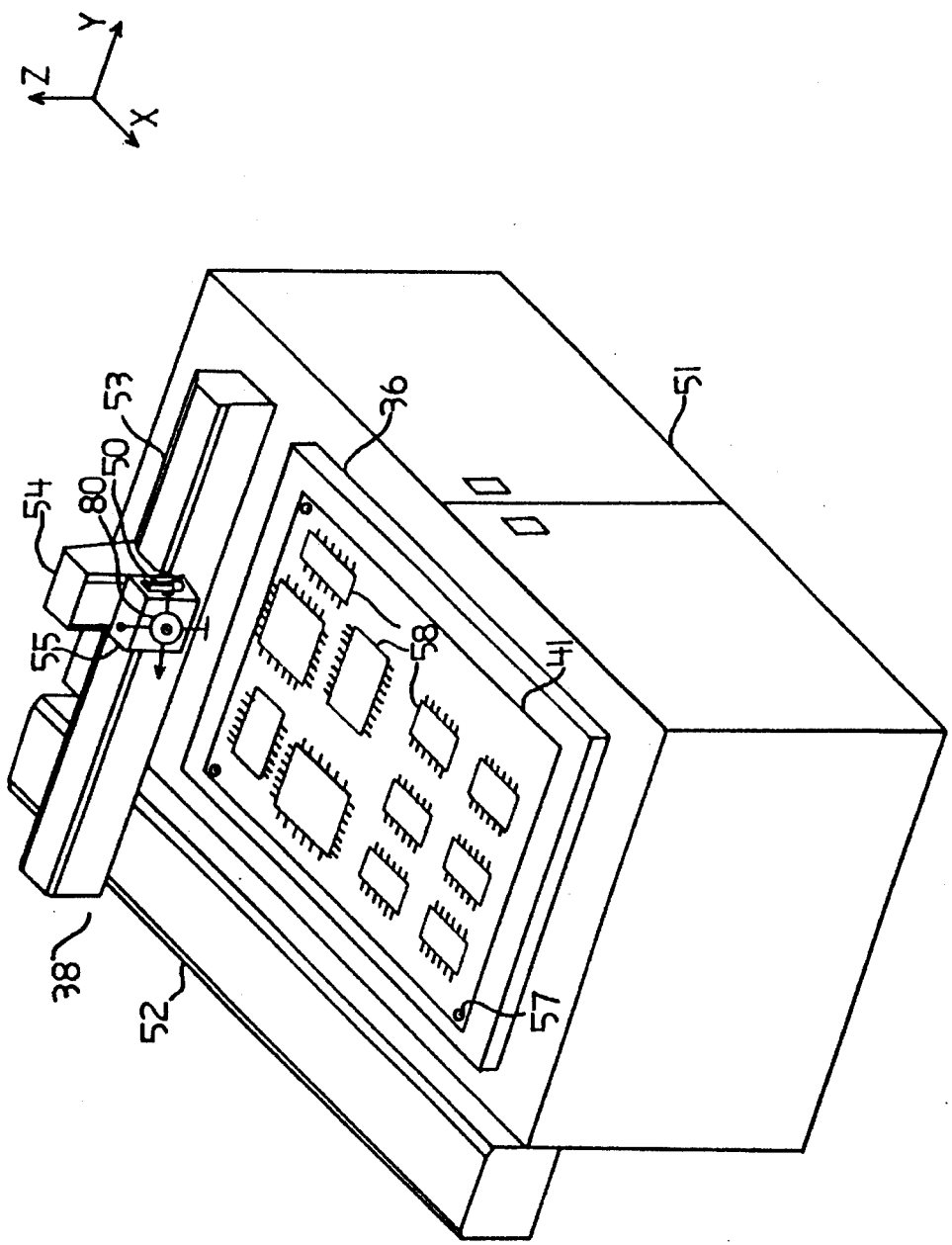
FIG. 8 shows a perspective view of a second embodiment of the present invention.
Figure 9:
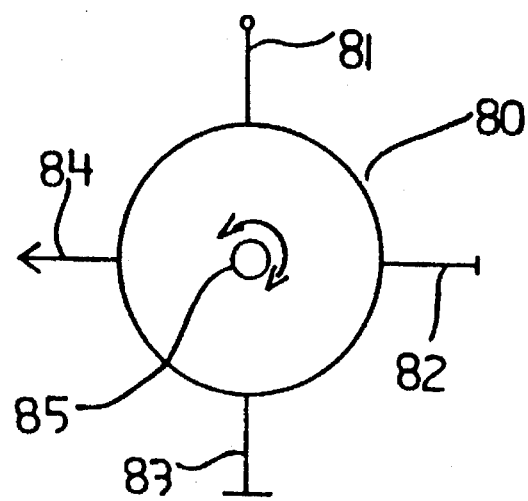
FIG. 9 shows a side view of a multi-probe test head according to the second embodiment of the present invention.
Figure 10:
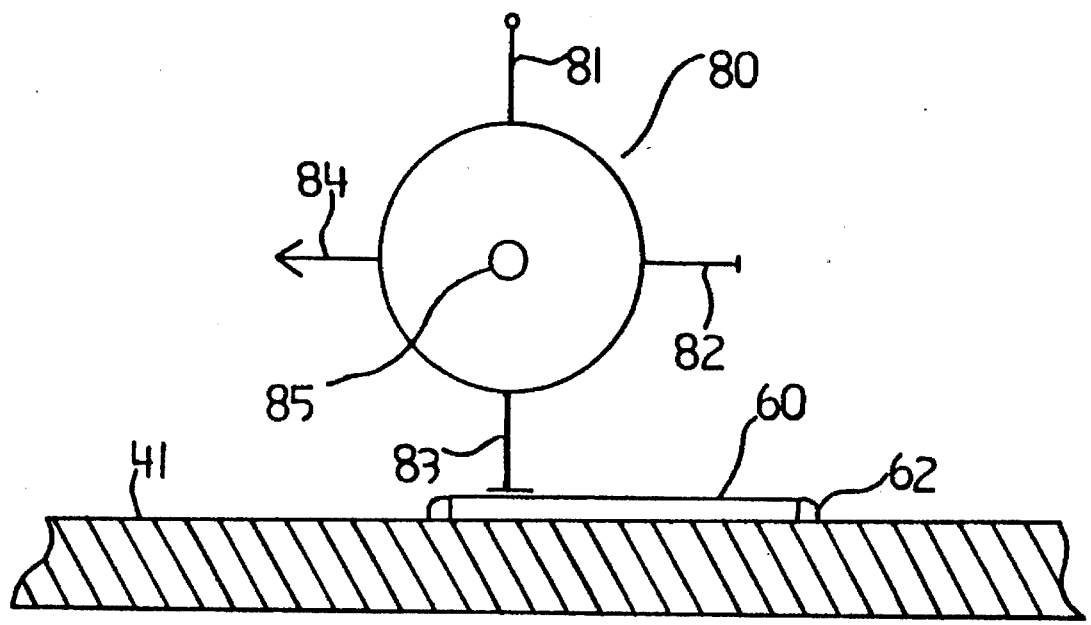
FIG. 10 shows a side view of an integrated circuit under test using the multi-probe test head of the second embodiment of the present invention.

Referring to FIGS. 8–10, a rotating turret, multi-probe test head 80 according to the second embodiment of the present invention is shown. Multi-probe test head 80 can hold several test probes 81–84. When a test is selected requiring a different test probe than the one currently being used, the controller 31 simply instructs the robot 38 to change test probes and the robot 38 rotates test head 80 about axis 85 to the selected test probe. For example, the types of test probes that may be used with test head 80 include, but are not limited to a general spring probe 84; a capacitive test probe 83, as described in U.S. patent application Ser. No. 07/981,665, now U.S. Pat. No. 5,420,500, by Kerschner et al., entitled Capacitive Electrode System For Detecting Open Solder Joints In Printed Circuit Assemblies, assigned to the assignee of the present application and incorporated herein by reference; subminiature capacitive test-probe 82, as described in U.S. patent application Ser. No. 07/820,711 now U.S. Pat. No. 5,274,336 by Crook et al., now U.S. Pat. No. 5,274,336 entitled Non-Contact Test Probe, assigned to the assignee of the present application and incorporated herein by reference; or any other type of test probe 81 now known or later developed, which is capable of being integrated into the test system of the present invention.

The electrical selection of the different test probes on the rotating turret multi-probe test head 80 could be accomplished by an additional control line from the controller or by mechanical switches activated by the position of the turret.

Other than the multi-probe test head and the ability to change test probes, all other aspects of the second embodiment of the present invention are identical to the first embodiment of the present invention.

Figure 11:
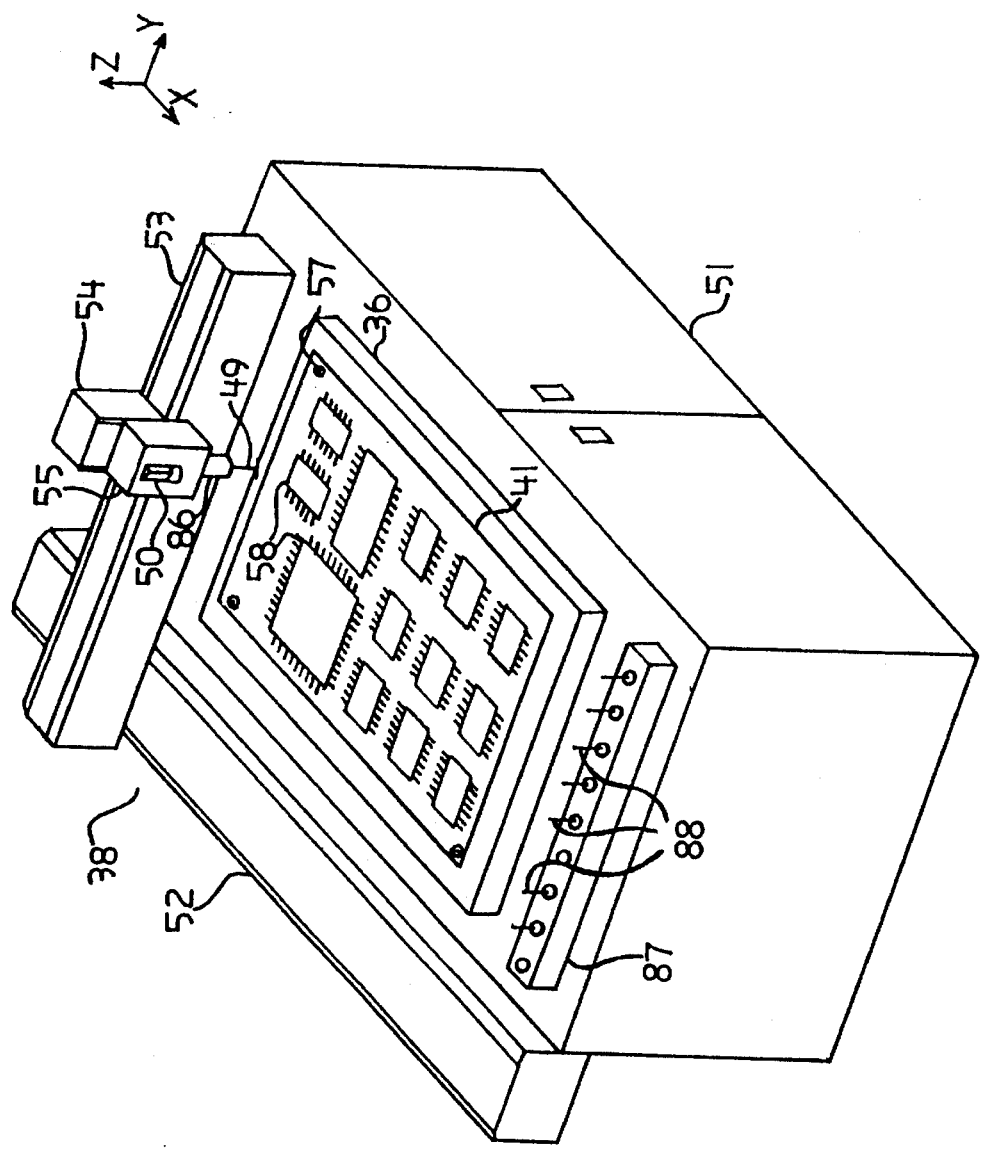
FIG. 11 shows a perspective view of a third embodiment of the present invention.

FIG. 11 shows a perspective view of a third embodiment of the present invention, which also allows the robot 38 to change test probes when a test requires a different test probe than the one currently in use. According to the third embodiment, probe holder 86 would be capable of grabbing and holding a test probe, either by means of a mechanical type probe holder, similar to element 69 as shown in FIG. 6, by means of a vacuum socket type holder, or by any other known means. The third embodiment also includes a test probe carousel 87, which holds numerous test probes 88. When a test is selected that requires a different test probe than the one currently attached to the robot, the controller instructs the robot to change test probes. The robot then moves to the test probe carousel 87, places the current test probe 49 in its appropriate place on the carousel 87, and picks up the test probe required for the next test.

Under this embodiment, each test probe can either be electrically connected to the test circuit by its own cable which is long enough to extend over the entire board under test 41 or a common cable connection can be supplied by the probe holder 86, with electrical connection being made when the individual probes are picked up—similar to a male/female type electrical connection. If a common cable is supplied, it should have a shielded coaxial cable for sending and receiving test signals and three unshielded cables for current (voltage) supply and ground. Such a common cable would be capable of handling the supply, ground and signal requirements of most of the currently known test probes. Of course, as technology changes, the requirements of the common cable may change. To obviate such design changes, each test probe could have its own electrical cable, which meets the individual test probe's supply, ground and signal requirements, as stated previously.

This embodiment of the present invention is attractive, because as new tests are developed, the software can be installed into the test system and the new test probe simply added to the test probe carousel 87, thus allowing for the simplest expansion for future test probes and test designs with the least amount of corresponding structural modifications to the test system of the present invention.

Figure 12:
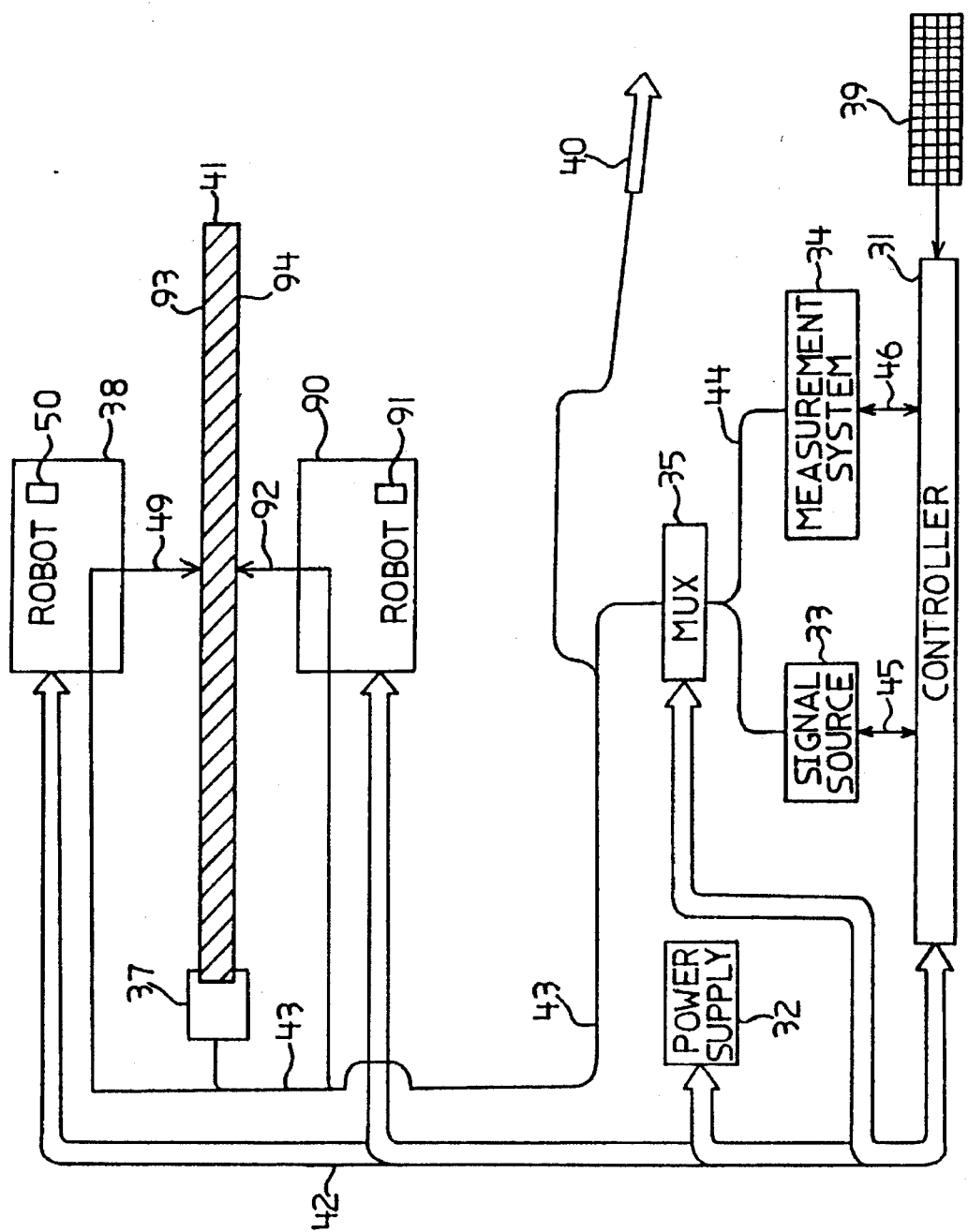
FIG. 12 shows a block diagram of an electronic printed circuit board test system according to a fourth embodiment of the present invention.

FIG. 12 shows a fourth embodiment of the present invention, which is similar to the first embodiment, except that the bed-of-nails fixture 36 is replaced by a second robot tester 90. According to this embodiment of the present invention, one of the robots will be used to test a particular device, while the other robot will supply the signal to the device and ground any upstream elements that need to be grounded during the test. For most tests, both of the robots will probably need more than one test head. Technology currently exists for robots with four test heads, which would give this two robot system eight test probes—more than enough to conduct any currently known test.

This embodiment is also more versatile for double sided printed circuit boards, as one robot 38 can be used to test the devices on one side of the board 93 while the second robot 90 supplies the voltage and ground requirements for the test from the second side 94 and then the second robot 90 can test the devices on the second side of the board 94 while the first robot 38 supplies the voltage and ground requirements for the test from the first side of the board 93.

Because this embodiment does not require a customized test fixture for each distinct printed circuit board as the first embodiment does, it will make testing less expensive, especially for low volume printed circuit boards. It will be readily appreciated that cameras 50 and 91 could be used in this embodiment for better accuracy in test probe placement by robots 38 and 90. Also, a multi-probe test head 80 or a test probe carousel 87 for switching between the different test probes necessary for different tests may be incorporated into the fourth embodiment of the present invention.

Figure 13:
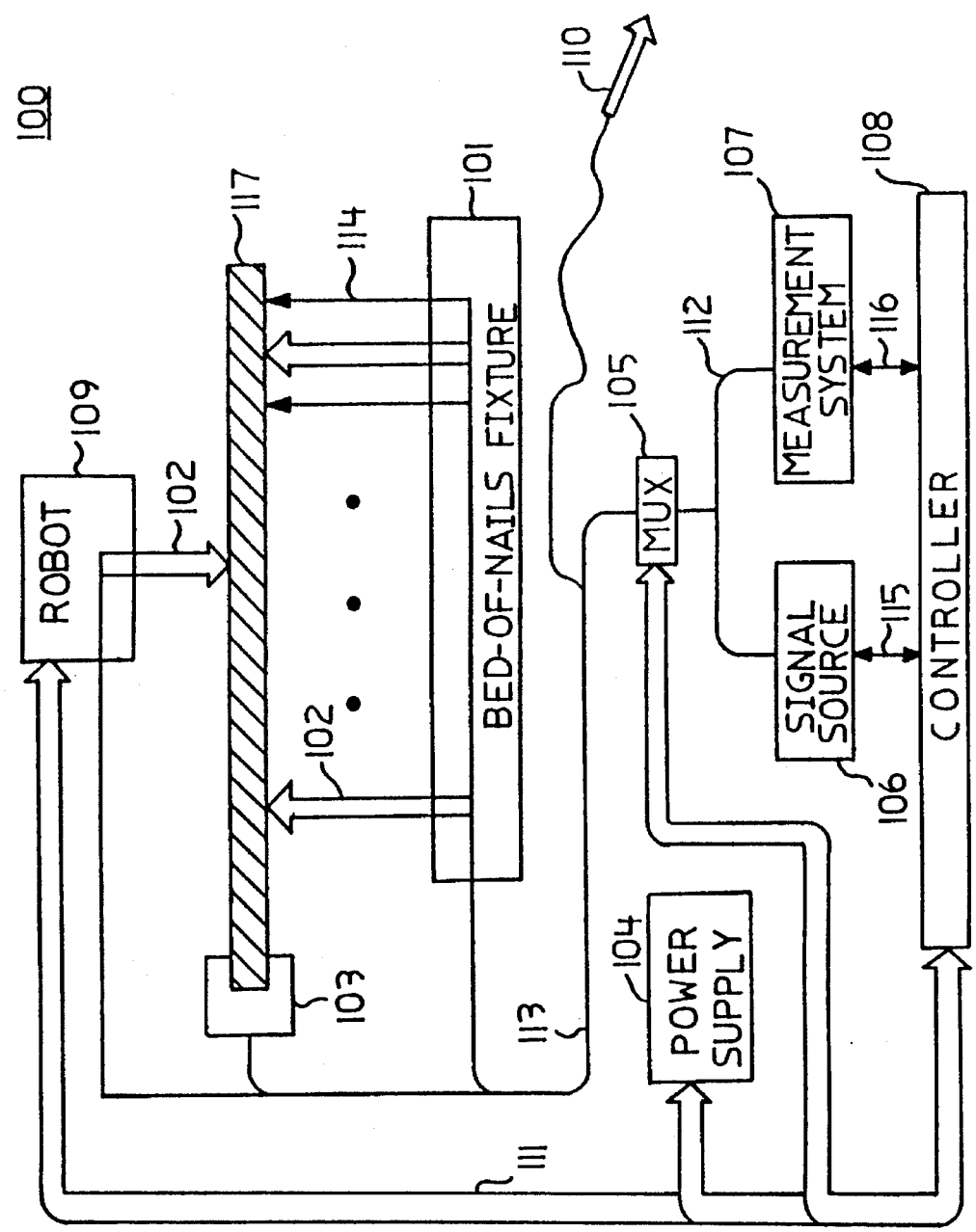
FIG. 13 shows a block diagram of an electronic printed circuit board test system according to the general concept of the present invention.

FIG. 13 illustrates the broadest concepts of the present invention. Because the invention allows signal acquisition without physical contact, signals can be acquired through layers of solder mask or conformal coating. Further, signals can be acquired from inner traces of a multi-layer printed circuit board. Additionally, the low coupling capacitance of the present invention guarantees minimal loading of the circuit under test and ensures that probing will not interfere with the operation of sensitive, high-speed circuitry.

The probe may be used in a variety of applications. For example, the probe may be fixed to a robot arm for automatic positioning and probing; a plurality of probes may be fixed in an array similar to the bed-of-nails type probes used by an automated tester; or the probe may be used in a hand-held fashion with an oscilloscope, logic analyzer, or during edge-connector functional backtrace testing.

An example of an automated printed circuit board test system which uses probe 102 is shown in FIG. 13. Test system 100 includes a controller 108, a power supply 104, a signal source 106, a measurement system 107, a multiplexor (MUX) 105, a bed-of-nails fixture 101, an edge-connector 103, a robotic positioner 109, and a hand-held probe 110. A board or assembly under test (BUT) 117 is interfaced with system 100 over a signal bus 113 via edge-connector 103 and/or bed-of-nails fixture 101.

Power supply 104 provides DC power to BUT 117 over signal bus 113. Signal source 106 includes analog function and frequency generators and digital pattern generators which generate the test signals required for testing BUT 117. Measurement system 107 is adapted to receive and analyze test signals from BUT 117. Measurement system 107 includes a plurality of digital receivers, signature analysis circuitry, and a variety of analog and/or digital measurement instrumentation (e.g., oscilloscopes, logic analyzers, distortion meters, etcetera).

MUX 105 receives test signals from signal source 106 over a bus 112 and supplies these test signals to the appropriate nodes of BUT 117 over signal bus 113. MUX 105 further receives signals from the appropriate nodes of BUT 117 over signal bus 113 and provides these signals to measurement system 107 over bus 112.

Controller 108 controls testing of board 117. Controller 108 communicates with signal source 106 over bus 115 and with measurement system 107 over a bus 116. Controller 108 communicates with power supply 104, MUX 105, and robotic positioner 109 over control bus 111.

Bed-of-nails fixture 101 may include a plurality of both capacitive probes 102 and conventional ohmic probes 114. Further, a capacitive probe 102 may be used with robotic positioner 109 and with hand-held probe 110. This brings the many advantages of the non-contact probe to an automated printed circuit board tester.

The foregoing description of the invention has been presented for purposes of illustration and description. It is not intended to be exhaustive or to limit the invention to the precise embodiments disclosed, and other modifications and variations may be possible in light of the above teachings. For example, multiple robot heads may be used in conjunction with a single bed-of-nails test fixture, in order to increase the overall testing speed or to incorporate different types of tests. Also, the types of test probes used in the test system may change with the technology of test probes or with the requirements of the particular test to be performed. The present invention allows a single test system to take advantage of existing test techniques and new test technologies as they are developed.

The embodiments were chosen and described in order to best explain the principles of the invention and its practical application to thereby enable others skilled in the art to best utilize the invention in various embodiments and modifications as are suited to the particular uses contemplated. It is intended that the appended claims be construed to include other alternative embodiments of the invention except insofar as limited by the prior art.

What is claimed is:

1. A test system for testing an electronic assembly having a first side and a second side, said test system comprising:

an electrical test means;

a bed-of-nails fixture means with mounting means for fixing said first side of said electronic assembly at a predetermined position adjacent said bed-of-nails fixture, said bed-of-nails fixture means having a plurality of test probes arranged to spatially correspond with predetermined electrical test access sites on said first side of said electronic assembly;

at least two test probes for obtaining electrical test access at predetermined sites on said second side of said electronic assembly;

robotic test probe positioning means with at least two test probe heads for individually positioning said at least one two test probes in an X-direction, a Y-direction and a Z-direction spatially adjacent said second side of said electronic assembly, said robotic test probe positioning means repositioning said at least two test probes via said at least two test probe heads during testing relative to each of said predetermined test access sites on said second side of said electronic assembly; and a controller for implementing and controlling the testing of said electronic assembly, wherein after a user selects a test to be run said controller implements said test and instructs said robotic test probe positioning means to individually move said at least two test probes to selected sites adjacent said second side of said electronic assembly, said controller further instructs said electrical test means to measure, excite and ground selected sites on said first side of said electronic assembly via said bed-of-nails fixture means and to measure, excite and ground selected sites on said second side of said electronic assembly via said at least two test probes.

2. The test system according to claim 1, wherein said at least two test probes comprise at least one non-contact test probe.

3. The test system according to claim 2, wherein said plurality of test probes comprises a plurality of spring probes.

4. The test system according to claim 3, wherein said at least one non-contact test probe capacitively couples to a predetermined site on said second side of said electronic assembly.

5. The test system according to claim 2, wherein said at least two robotic test probe positioning means positions said at least one non-contact test probe directly over selected electrical components or test points on said electronic assembly.

6. The test system according to claim 1 further comprising:

a connector means electrically coupled to said electronic assembly, wherein said connector means provides further electronic test access to said electronic assembly.

7. The test system according to claim 1 further comprising:

a camera coupled to said robotic test probe positioning means, whereby said camera aligns said robotic test probe positioning means with said electronic assembly to compensate for misalignment.

8. A test system for testing an electronic assembly having a first side and a second side, said test system comprising:

an electrical test means;

a bed-of-nails fixture means with mounting means for fixing said first side of said electronic assembly at a predetermined position adjacent said bed-of-nails fixture, said bed-of-nails fixture means having a plurality of test probes arranged to spatially correspond with predetermined electrical test access sites on said first side of said electronic assembly;

at least one test probe for obtaining electrical test access at predetermined sites on said second side of said electronic assembly;

robotic test probe positioning means for positioning said at least one test probe in an X-direction, a Y-direction and a Z-direction spatially adjacent said second side of said electronic assembly, wherein said robotic test probe positioning means further comprises a multi-probe turret for holding a plurality of different types of test probes; and a controller for implementing and controlling the testing of said electronic assembly, wherein after a user selects a test to be run said controller implements said test and instructs said robotic test probe positioning means to move said at least one test probe to selected sites adjacent said second side of said electronic assembly, said controller further instructs said electrical test means to measure, excite and ground selected sites on said first side of said electronic assembly via said bed-of-nails fixture means and to measure, excite and ground selected sites on said second side of said electronic assembly via said at least one test probe.

9. The test system according to claim 8, wherein said controller selects an appropriate test probe from said plurality of different types of test probes when a test is selected, whereby said controller instructs said robotic test probe positioning means to rotate said multi-probe turret to said appropriate test probe.

10. A test system for testing an electronic assembly having a first side and a second side, said test system comprising:

an electrical test means;

a bed-of-nails fixture means with mounting means for fixing said first side of said electronic assembly at a predetermined position adjacent said bed-of-nails fixture, said bed-of-nails fixture means having a plurality of test probes arranged to spatially correspond with predetermined electrical test access sites on said first side of said electronic assembly;

at least one test probe for obtaining electrical test access at predetermined sites on said second side of said electronic assembly;

robotic test probe positioning means for positioning said at least one test probe in an X-direction, a Y-direction and a Z-direction spatially adjacent said second side of said electronic assembly;

a controller for implementing and controlling the testing of said electronic assembly, wherein after a user selects a test to be run said controller implements said test and instructs said robotic test probe positioning means to move said at least one test probe to selected sites adjacent said second side of said electronic assembly, said controller further instructs said electrical test means to measure, excite and ground selected sites on said first side of said electronic assembly via said bed-of-nails fixture means and to measure, excite and ground selected sites on said second side of said electronic assembly via said at least one test probe; and a carousel of different types of test probes positioned within said robotic test probe positioning means range of travel, whereby said robotic test probe positioning means switches test probes when instructed to do so by said controller.

11. A test system for testing an electronic assembly having a first side and a second side, said test system comprising:

an electrical test means;

a bed-of-nails fixture means with mounting means for fixing said first side of said electronic assembly at a predetermined position adjacent said bed-of-nails fixture, said bed-of-nails fixture means having a plurality of test probes arranged to spatially correspond with predetermined electrical test access sites on said first side of said electronic assembly;

at least one test probe for obtaining electrical test access at predetermined sites on said second side of said electronic assembly;

robotic test probe positioning means for positioning said at least one test probe in an X-direction, a Y-direction and a Z-direction spatially adjacent said second side of said electronic assembly;

a controller for implementing and controlling the testing of said electronic assembly, wherein after a user selects a test to be run said controller implements said test and instructs said robotic test probe positioning means to move said at least one test probe to selected sites adjacent said second side of said electronic assembly, said controller further instructs said electrical test means to measure, excite and ground selected sites on said first side of said electronic assembly via said bed-of-nails fixture means and to measure, excite and ground selected sites on said second side of said electronic assembly via said at least one test probe; and a camera coupled to said robotic test probe positioning means, whereby said camera aligns said robotic test probe positioning means with said electronic assembly to compensate for misalignment, wherein said camera performs optical inspections of said electronic assembly to check for defects in said electronic assembly.

12. A test system for testing an electronic assembly having a first side and a second side, said test system comprising:

an electrical test means;

a bed-of-nails fixture means with mounting means for fixing said first side of said electronic assembly at a predetermined position adjacent said bed-of-nails fixture, said bed-of-nails fixture means having a plurality of test probes arranged to spatially correspond with predetermined electrical test access sites on said first side of said electronic assembly;

at least one test probe for obtaining electrical test access at predetermined sites on said second side of said electronic assembly;

robotic test probe positioning means for positioning said at least one test probe in an X-direction, a Y-direction and a Z-direction spatially adjacent said second side of said electronic assembly;

a controller for implementing and controlling the testing of said electronic assembly, wherein after a user selects a test to be run said controller implements said test and instructs said robotic test probe positioning means to move said at least one test probe to selected sites adjacent said second side of said electronic assembly, said controller further instructs said electrical test means to measure, excite and ground selected sites on said first side of said electronic assembly via said bed-of-nails fixture means and to measure, excite and ground selected sites on said second side of said electronic assembly via said at least one test probe; and a camera coupled to said robotic test probe positioning means, whereby said camera aligns said robotic test probe positioning means with said electronic assembly to compensate for misalignment, wherein said camera also provides vision for positioning of said at least one test probe over fine pitch elements on said second side of said electronic assembly, wherein said positioning of said at least one test probe is performed by said robotic test probe positioning means.

13. A test system for testing an electronic assembly having a plurality of electronic components, said electronic assembly having a first side and a second side, said test system comprising:

an electrical test means;

a connector means coupled to said electronic assembly for providing electrical access to said electronic assembly;

a bed-of-nails fixture with mounting means for fixing said first side of said electronic assembly at a predetermined position adjacent said bed-of-nails fixture, said bed-of-nails fixture having a plurality of test probes arranged to spatially correspond with predetermined measurement, excitation and ground sites on said first side of said electronic assembly;

at least two test probes for measuring, exciting or grounding predetermined sites on said second side of said electronic assembly;

robotic test probe positioning means with at least two test probe heads for individually positioning said at least two test probes at predetermined positions in an X-direction, a Y-direction and a Z-direction spatially adjacent said second side of said electronic assembly; and a controller for implementing and controlling the testing of said electronic assembly, whereby after a user selects a test to be run said controller instructs said robotic test probe positioning means to individually move said at least two test probes to selected sites adjacent said second side of said electronic assembly, said controller further instructs said electrical test means to measure, excite and ground selected sites on said first side of said electronic assembly via said bed-of-nails fixture and to measure, excite and ground selected sites on said second side of said electronic assembly via said at least two test probes.

14. A test system according to claim 13 further comprising:
   a camera coupled to said robotic test probe positioning means for aligning said robotic test probe positioning means with fiducials on said electronic assembly, said camera also provides vision for positioning of said at least two test probes over fine pitch elements on said second side of said electronic assembly, wherein said positioning of said at least two test probes is performed by said robotic test probes positioning means.

15. A test system for testing an electronic assembly having a first side and a second side, said test system comprising:
   a first set of at least two test probes for measuring, exciting or grounding predetermined sites on said first side of said electronic assembly;
   a first robotic test probe positioning means with at least two test probe heads for individually positioning said at least two test probes of said first set of test probes at predetermined positions in an X-direction, a Y-direction and a Z-direction spatially adjacent said first side of said electronic assembly;
   a second set of at least two test probes for measuring, exciting or grounding predetermined sites on said second side of said electronic assembly;
   a second robotic test probe positioning means with at least two test probe heads for individually positioning said at least two test probes of said second set of test probes at predetermined positions in an X-direction, a Y-direction and a Z-direction spatially adjacent said second side of said electronic assembly; and
   a controller for implementing and controlling the testing of said electronic assembly, whereby after a user selects a test to be run said controller instructs said first robotic test probe positioning means to move said at least two test probes of said first set of test probes spatially adjacent to selected sites on said first side of said electronic assembly and to measure, excite or ground selected sites on said first side of said electronic assembly, said controller further instructs said second robotic test probe positioning means to move said at least two test probes of said second set of test probes spatially adjacent to selected sites on said second side of said electronic assembly and to measure, excite or ground selected sites on said second side of said electronic assembly.

16. A test system according to claim 15 further comprising a connector means coupled to said electronic assembly for providing electrical access to said electronic assembly.

17. A method of testing an electronic assembly for defects, said electronic assembly having a first side and a second side, such that when an electrical signal is supplied to a predetermined site on said electronic assembly, a measuring means measures a parameter of a corresponding signal detected by a test probe at a different predetermined site on said electronic assembly and indicates an error if the measured parameter is not within predetermined limits, said method comprising the steps of:
   (a) supplying ground to predetermined sites on said first side of said electronic assembly with a plurality of test probes on a bed-of-nails test fixture;
   (b) supplying a signal to at least one predetermined site on said first side of said electronic assembly with at least one test probe on said bed-of-nails test fixture;
   (c) individually, robotically positioning a test probe with a test probe head to a predetermined site spatially adjacent to a predetermined site on said second side of said electronic assembly;
   (d) sensing a signal with said test probe at said predetermined site spatially adjacent to a predetermined site on said second side of said electronic assembly; and
   (e) measuring said sensed signal with a measuring system to determine if the signal falls within predetermined limits.

18. The method according to claim 17, said method comprising the initial steps of:
   robotically positioning a test probe spatially over each of said plurality of test probes in said bed-of-nails test fixture;
   correspondingly exciting each of said plurality of test probes in said bed-of-nails test fixture;
   sensing a signal at each test probe in said bed-of-nails test fixture as each test probe is excited; and
   measuring said sensed signal to determine if each test probe in said bed-of-nails test fixture is properly wired.

19. The method according to claim 17, wherein said robotically positioned test probe is a non-contact test probe.

20. The method according to claim 17, said method comprising the further step of:
   performing back trace with a second test probe to determine the location of any faulty components or wiring, said back trace being performed whenever an error is detected by said measuring system.

21. A method of testing for defects in an electronic assembly having a first side and a second side, such that when an electrical signal is supplied to a predetermined site on said electronic assembly, a measuring means measures a parameter of a corresponding signal detected by a test probe at a different predetermined site on said electronic assembly and indicates an error if the measured parameter is not within predetermined limits, said method comprising the steps of:
   (a) supplying electrical test access to a plurality of predetermined sites on said first side of said electronic assembly with a plurality of test probes in a bed-of-nails test fixture;
   (b) supplying an electrical signal to a predetermined site on said second side of said electronic assembly with a test probe individually robotically positioned with a test probe head over said predetermined site;
   (c) sensing a signal with a predetermined test probe of said plurality of test probes in said bed-of-nails test fixture at a predetermined site of said plurality of sites on said first side of said electronic assembly; and
   (d) measuring said sensed signal with a measuring system to determine if the signal falls within predetermined limits.

* * * * *